US007725863B2

(12) United States Patent
Mayer

(10) Patent No.: US 7,725,863 B2
(45) Date of Patent: May 25, 2010

(54) REVERSE ROUTING METHODS FOR INTEGRATED CIRCUITS HAVING A HIERARCHICAL INTERCONNECT ARCHITECTURE

(75) Inventor: Ernst Mayer, Cupertino, CA (US)

(73) Assignee: Agate Logic, Inc., Cupertino, CA (US)

( * ) Notice: Subject to any disclaimer, the term of this patent is extended or adjusted under 35 U.S.C. 154(b) by 435 days.

(21) Appl. No.: 11/712,308

(22) Filed: Feb. 27, 2007

(65) Prior Publication Data

US 2008/0209383 A1    Aug. 28, 2008

(51) Int. Cl.
 *G06F 17/50* (2006.01)
(52) U.S. Cl. .................................................. 716/13
(58) Field of Classification Search ............. 716/12–14, 716/16
See application file for complete search history.

(56) References Cited

U.S. PATENT DOCUMENTS

| | | | | |
|---|---|---|---|---|
| 5,187,671 A * | 2/1993 | Cobb | ............................ | 716/12 |
| 5,581,738 A * | 12/1996 | Dombrowski | ................ | 716/16 |
| 5,742,181 A * | 4/1998 | Rush | ............................ | 326/41 |
| 6,378,961 B1 * | 4/2002 | Hara et al. | ................... | 303/193 |
| 6,801,052 B2 | 10/2004 | Pugh et al. | | |
| 6,988,257 B2 * | 1/2006 | Teig et al. | ....................... | 716/13 |
| 6,996,789 B2 * | 2/2006 | Teig et al. | ....................... | 716/4 |
| 7,010,771 B2 * | 3/2006 | Teig et al. | ....................... | 716/14 |
| 7,392,498 B1 * | 6/2008 | Srinivasan et al. | ............ | 716/16 |
| 7,480,885 B2 * | 1/2009 | Frankle et al. | ................. | 716/12 |
| 2003/0163796 A1 * | 8/2003 | Snider | .......................... | 716/12 |

OTHER PUBLICATIONS

Lai, Yen-Tai et al., "Hierarchical interconnection structures for field programmable gate arrays", Jun. 1997, IEEE Transactions on very large scale integration (VLSI) systems, vol. 5, No. 2. pp. 186-196.*

* cited by examiner

*Primary Examiner*—Stacy A Whitmore
(74) *Attorney, Agent, or Firm*—Venture Pacific Law, PC

(57) ABSTRACT

The present invention relates to methods for the global and detail routing of integrated circuits with hierarchical interconnect routing architecture. The methods includes the steps of: mapping routing resources of said integrated circuit to the nodes and edges of a graph theoretic tree, mapping each target to a target node; mapping each driver to a driver node; and routing each driver and its targets as a function of the minimum spanning tree spanning each driver node and its target nodes by traversing from the target nodes of a driver backwards toward its driver node in said tree. The methods of this invention are straightforward to implement, of polynomial time complexity, and can optimize routing resource usage.

20 Claims, 8 Drawing Sheets

REVERSE ROUTING METHODS FOR INTEGRATED CIRCUITS HAVING A HIERARCHICAL INTERCONNECT ARCHITECTURE

FIELD OF INVENTION

This invention relates to routing methods for routing interconnections of an integrated circuit design. In particular, it relates to routing methods for integrated circuits having an hierarchical interconnect architecture.

BACKGROUND

Integrated circuits for devices such as field programmable gate arrays comprise of logic and other functional cells that can be interconnected with each other and to the inputs (targets) and outputs (drivers) allowing for the transmission of signals within the integrated circuit. Interconnect resources or interconnects can be wires or other channels designed for carrying signals. They can also be multiplexers. A multiplexer is a switch that allows one to choose among a variety of detailed point to point signal routing paths, much like a tracked switch on a section of a railroad. Multiplexers are typically connected to the logic and functional cells and other multiplexers by other interconnects such as wires and vias.

Each driver in an integrated circuit can be designed to be connected to a set of one or more targets via logic or functional cells to form a signal net in order to implement a specific logic or function. Signal routing, or global routing, is the patterning or programming of interconnects of integrated circuits to connect each driver of an integrated circuit with its particular set of targets to form a signal net for each driver.

Traditionally, interconnect architectures for routing, also referred to herein as Interconnect Routing Architectures (IRAs), are the structures of the interconnect system for routing on an integrated circuit. They are often in the form of a mesh. "Flexibility of Interconnection Structures for Field Programmable Gate Arrays", J. Rose and S. Brown, *IEEE Journal of Solid-State Circuits*. vol. 26, no. 3, Mar. 1991. Hierarchical interconnect architectures for routing, also referred to herein as Hierarchical Interconnect Routing Architectures (HIRAs), are interconnect structures for routing where the interconnect resources for routing, i.e., routing resources, can be mapped into a graph theoretic tree, also referred to herein as a tree. United States patent application, Hierarchical Multiplexer-Based Integrated Circuit Interconnect Architecture for Scalability and Automatic Generation," having a U.S. Pat. No. 6,801,052 B2, is a HIRA where the routing resources and the core cells are placed hierarchically in a plurality of levels in the form of a tree. HIRAs provide predictable routing delay between adjacent levels of the hierarchy, have high scalability, and allow for high resource utilization.

Existing methods for the global routing of ERAs convert the routing resources to a graph consisting of a finite set of nodes together with a finite set of edges, each of which connects a pair of nodes. The classic expansion or "maze" routing methods are routing methods with algorithms that expand outwards from a driver to explore and locate all possible paths or routings to its set of targets, similar to the exploration of all possible paths in a maze. However, the complexity of these routing methods are non-polynomial (NP) hard, i.e., the work needed to find an optimal solutions increase exponentially with the number of nodes and edges in the graph. As a consequence, approximate solution methods have to be used. These methods tend to lead to suboptimal routing resource usage, either due to excess wire lengths required to route or the unnecessary branching of the routes.

Another method for routing in an IRA involves the solving of a Minimal Spanning Tree (MST) Problem for each net, i.e., for each driver and its targets. From the standpoint of resource usage, this method is attractive as it is often superior to the simple maze expansion methods as its run-time is merely polynomial. However, this method still leads to suboptimal resource usage. In IRAs that can only be mapped to a graph and not to a tree, the solving of a straight forward Minimal Spanning Tree problem does not account for that fact that most IRAs allow for branch nodes. Optimal routing for any signal net is only achieved by the optimal placement of these branch nodes. In the worse case scenario, this process is NP complete, i.e., it may require an exponential run-time. Moreover, where there are multiple nets competing for a common set of routing resources, routing congestion, i.e., the lack of sufficient routing resources that can be assigned, is often encountered, especially with routing methods where routing resource usage are suboptimal.

More advanced routing methods typically involve solving, either exactly or approximately, a Graph Steiner Minimal Tree problem. These problems are NP-hard. A provable optimal solution requires exponentially large computational time to find. Therefore, finding optimal solutions becomes intractable, except for all but very small IRAs. Approximate solutions that can be found in polynomial time are non-optimal.

As a result of routing resource constraints related to the size and power consumption of an integrated circuit, the general problem of signal routing is NP "hard" or NP complete, i.e., non-deterministic polynomial complete. The difficulty of finding a globally optimal solution can increase exponentially with the size of the routing problem, a function of the size of the IRA and the number of signal nets and the quantity of available routing resources. "New Performance-Driven FPGA Routing Algorithms", M. J. Alexander and G. Robins, http://www.cs.virginia.edu/~robins/FPGA/DAC 95 Paier.html.

Due to the limitations of the prior art, it is therefore desirable to have novel methods for routing with run-time that is polynomial and not NP hard and where routing resource usage is optimal.

SUMMARY OF INVENTION

An object of this invention is to provide methods for routing HIRAs with polynomial run-time that are straightforward to implement.

Another object of this invention is to provide methods for routing HIRAs that can optimize resource usage.

The present invention relates to methods for the global and detail routing of integrated circuits with hierarchical interconnect routing architecture. The methods include the steps of: mapping routing resources of said integrated circuit to the nodes and edges of a tree; mapping each target to a target node; mapping each driver to a driver node; and routing each driver and its targets as a function of the minimum spanning tree spanning each driver node and its target nodes by traversing from the target nodes of a driver toward its driver node in said tree. The methods of this invention are straightforward to implement, are of polynomial time complexity, and can optimize routing resource usage.

An advantage of this invention is that the methods of this invention can optimize routing resource usage in a HIRA and are straightforward to implement.

Another advantage of this invention is that the methods of this invention are of polynomial run-time complexity.

DESCRIPTION OF DRAWINGS

The foregoing and other objects, aspects and advantages of the invention will be better stood from the following detailed description of preferred embodiments of this invention taken in conjunction with the accompanying drawings in which.

DETAILED DESCRIPTION OF THE PREFERRED EMBODIMENTS

The present disclosure utilizes the following definitions which shall be understood in proper context its usage and shall not be construed as limiting the scope of the present invention as claimed.

Figure 1:
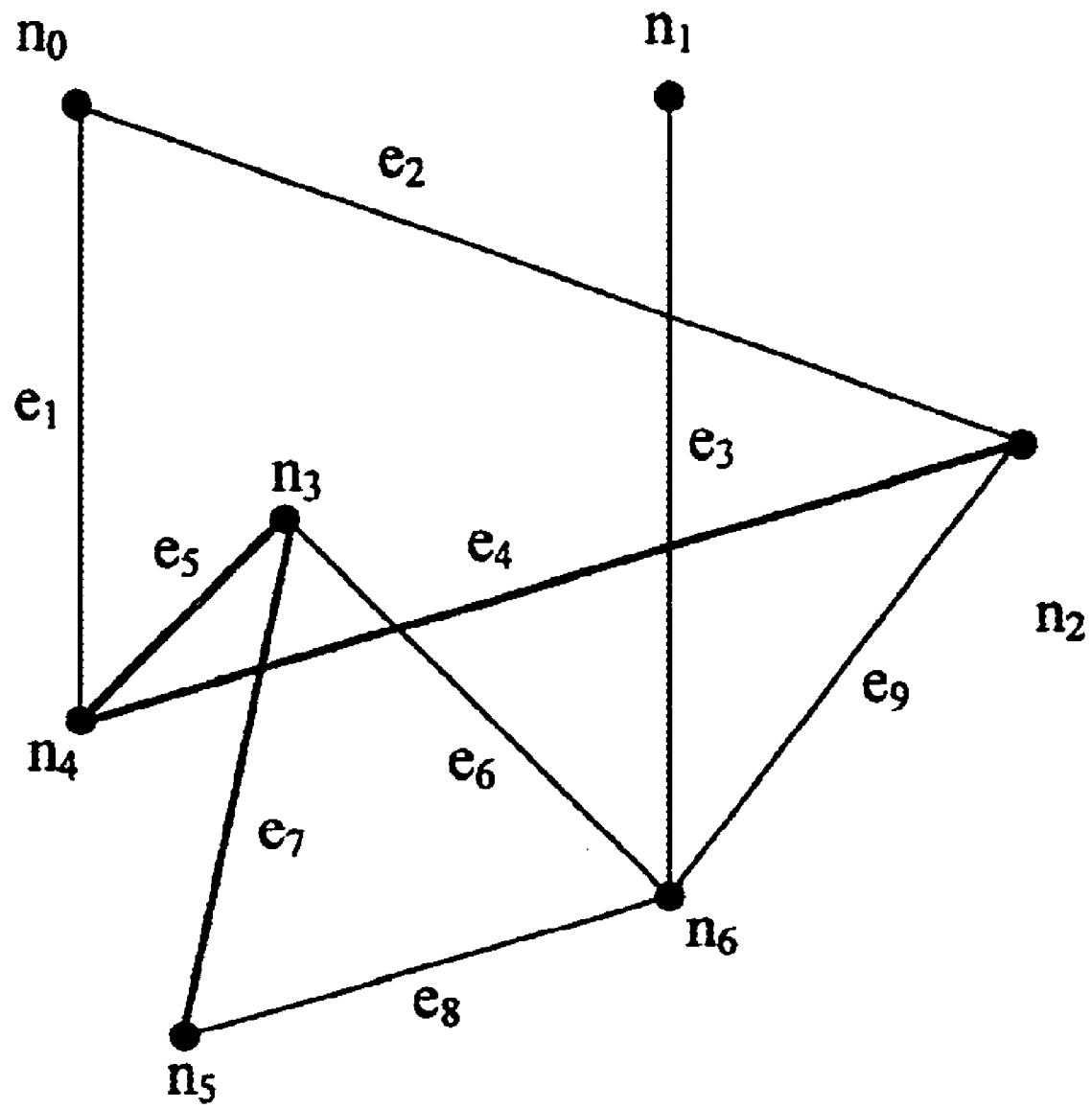
FIG. 1 is an example of a graph.

Graph. A graph is an abstract mathematical construct consisting of a finite set of nodes or vertices. FIG. 1 is an example of a graph with 7 nodes, $n_0$, $n_1$, $n_2$, $n_3$, $n_4$, $n_5$, and $n_7$. In the figures described herein, nodes are denoted by a dot.

Edges. The lines on a graph that connect two nodes. In a graph, not all nodes have to be connected by edges. Two edges are adjacent if they are incident upon a common node of a graph. The graph of FIG. 1 has 9 edges, $e_1$, $e_2$, $e_3$, $e_4$, $e_5$, $e_6$, $e_7$, $e_8$, and $e_9$, where $e_1$ and $e_2$ is an example of adjacent edges. In the figures described herein, edges are denoted by a straight line connecting two nodes.

Path. A chain of nodes connected by adjacent edges with no nodes repeated is referred to as a path. A one-edge path is an edge connecting two nodes. An example of a one edge path in the graph in FIG. 1 is the $e_6$ edge between the nodes $n_3$ and $n_6$. An example of a three-edge path in FIG. 1 between the nodes $n_2$ and $n_5$ are the edges $e_7$, $e_6$, and $e_9$. The path between two nodes is the pattern created by traversing from one node to another by traversing along the edges. The length of a path is the sum of the length of all the edges in the path. If the length of each edge of a path is assumed to be equal, then the length of a path is equal to the number of edges. The shortest path connecting two nodes is the path with the shortest length. The shortest path may not be unique in a graph.

Figure 2:
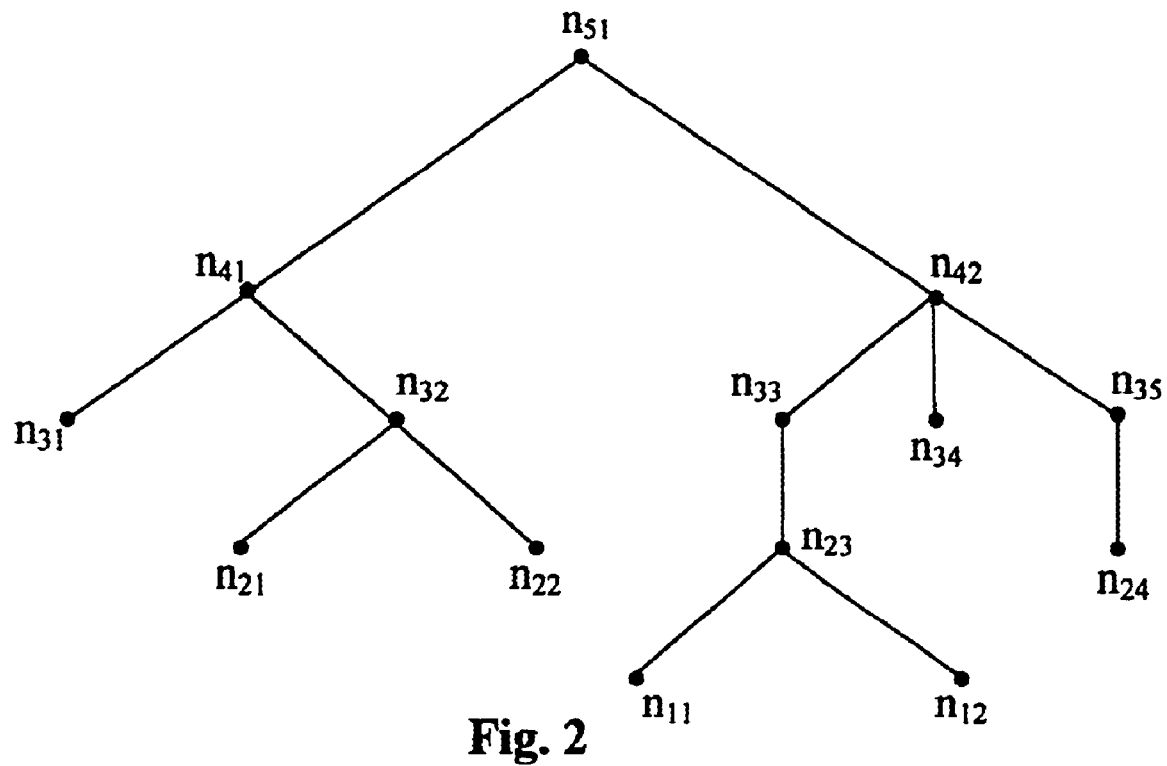
FIG. 2 is an example of a tree.

Tree. A tree is a graph that satisfies the following conditions: (a) the graph is connected, i.e., there is a path between any pair of nodes in the graph; and (b) the graph has (N-1) edges where N is the number of nodes in the graph. FIG. 2 is an example of a tree with multiple nodes. For simplicity, the nodes in FIGS. 2 are arranged such that the edges of the trees shown do not cross each other, this common visual expedient is a property of a tree. However, all trees can be drawn such that their edges do not cross each other. For the trees illustrated in FIGS. 2 through 6, nodes are represented as $n_{ij}$ where "i" and "j" are integers.

Root node. A node of a tree that is selected as the reference node.

Level. The level of a node is a measure of the lowest number of edges from said node to the root node. The root node is selected to be at the highest level of the tree. The number of tree edges from the root node to a node at the lowest level of a tree is the maximum. The tree illustrated in FIG. 2 has five levels. A node in the tree is represented as nij where i is the level of the node. The root node is represented as $n_{51}$, the only node at the highest level.

Traversing upwards and downwards. Traversing upwards a tree is to traverse from a lower level to a higher level of a tree along edges from one node to another. Similarly, traversing downwards a tree is to traverse from a higher level to a lower level of a tree along edges from one node to another.

Ancestor and descendant. A node is the ancestor of its descendant node if said ancestor node can be reached from said descendant node by traversing upwards. For example, in FIG. 2 node $n_{42}$ is the ancestor for the descendant nodes $n_{33}$, $n_{34}$, and $n_{35}$.

Common ancestor. The common ancestor of two or more nodes is the lowest level node in a tree that is an ancestor for said two or more nodes. For example, in FIG. 2, node $n_{42}$ is the common ancestor for nodes $n_{11}$, $n_{12}$, and $n_{24}$ and node $n_{51}$ is the common ancestor for node $n_{31}$ and $n_{11}$.

Target node. The node of a tree that a target is mapped to.

Driver node. The node of a tree that a driver is mapped to.

Peak. The peak of a target is the common ancestor of a target and its driver.

Route. The route of a target is a path between a target and its driver. The route of a target is the pattern that can be generated by traversing between the target node and its driver along the edges of the edges.

Global routing. Global routing of a circuit is the selecting of global net topologies, i.e., collection of nodes and edges of the graph to connect the drivers with their particular targets for the signal nets in the logic design. Global routing is the generating of routes, i.e., route topologies for signal nets, in a graph that an IRA can be mapped to or in a tree that a HIRA can be mapped to, for targets in a circuit.

Detail routing. The assignment of physical routing resources at each node and edge along the routes generated by global routing.

Branch node. The branch node for two or more particular targets of a driver is the lowest level node shared by the routes of said two or more particular targets of a driver. The branch node for two or more particular targets of a driver is the common ancestor for said two or more particular target nodes.

Posterior route. The posterior route of a target at a branch node for that target is the portion of the route of said target from said branch node through its peak to its driver.

Processed target. A processed target is a target for a driver having a generated route.

Signal net. A signal net for a driver is the routes for all the targets of the driver. Each target is associated with a driver in a signal net. Therefore, the driver associated with a target is referred to as that target's driver in a signal net.

The preferred embodiments of the present invention provide routing methods for routing the interconnect networks of integrated circuits with a hierarchical interconnect routing architecture where the routing resources can be mapped to a graph theoretic tree, also simply referred to as a tree. An example of a HIRA is presented in a previous patent application entitled "Hierarchical Multiplexer-Based Integrated Circuit Interconnect Architecture for Scalability and Automatic Generation" with United States Patent Application No. #20030039262. The interconnect networks based upon Benes networks described in "Interconnection Network for a Field Programmable Gate Array," U.S. Pat. No. 6,940,308, and "Interconnection Network for a Field Programmable Gate Array," U.S. Pat. No. 6,693,456, are other examples of HIRAs.

In this type of integrated circuit, the basic lowest level functional units, called core cells, which are built around bitwise lookup tables and provide support for various basic arithmetic and logical operations, are interconnected by blocks of multiplexers at each level of the hierarchy, i.e., tree, while the interconnects for the multiplexers between the levels connect the corecells of different levels. The blocks of multiplexers, routing resources, are mapped to the nodes of a tree and the wires that form the interconnections connecting the blocks of multiplexers from one level to another, also routing resources, are mapped to the edges of the tree. HIRAs can also have other types of routing resources such as wires or vias as long as their routing resources can be mapped to the nodes and edges of a tree.

HIRAs have many advantages. They provide predictable and identical routing delay between adjacent levels of the hierarchy. They are highly scalable and allow for high resource utilization. In some architectures such as the multiplexer-based HIRA referred to in U.S. Patent Application No. #20030039262, they can routinely provide above 80% logic usage.

The scalability advantage of HIRAs is achieved without the need for egregious interconnect requirements. Even though the number of logic cells is $=4^{(number\ of\ hierarchy\ levels)}$ in a quadtree logic architecture, Rent's Rule of the multiplexer interconnects between levels can be tailored to optimize the tradeoff between routability and silicon area needed for interconnect. In a typical scenario, if the logic placement is good, i.e., if the highly correlated logic units that share many signal nets are clustered close to each other, and the routing algorithm is minimizing routing resource usage well, relatively few signal nets will span the entire logic hierarchy. Even for those that do span the entire logic hierarchy, only a few edges of the hierarchical tree corresponding to the routing of such an array-spanning signal net will occur at the upper levels of the hierarchy. Therefore, relatively few routing resources are needed to traverse the signal across the top levels of the interconnect architecture.

Routing of an integrated circuit includes global routing and detail routing. Global routing of a circuit is the selecting of global net topologies, i.e., collection of nodes and edges of the graph to connect the drivers with their particular targets for the signal nets in the logic design. It is the generating of routes, i.e., route topologies for signal nets, in a graph that an IRA can be mapped to or in a tree that a HIRA can be mapped to, for targets in a circuit such that signals can be transmitted between a driver and its targets. Preferred methods for global routing HIRAs map the routing resources to a tree and then generate the routes for the targets of the HIRAs on the mapped tree.

Detail routing is the physical assignment of routing resources for specific purposes for each node and edge along the routes generated by global routing.

Once a HIRA is mapped to a tree, preferred methods for global routing reduce to the problem finding the minimal spanning tree within the tree for each signal net. A presently preferred method of the global routing of HIRAs may comprise the steps of:

mapping routing resources of said HIRA to the nodes and edges of a tree having one or more nodes at one or more levels and one or more edges connecting said nodes;

mapping each target to a node of said tree;

mapping each driver to a node of said tree;

selecting or identifying the root node;

specifying the levels of each node for said tree; and routing said targets and said drivers.

Figure 3:
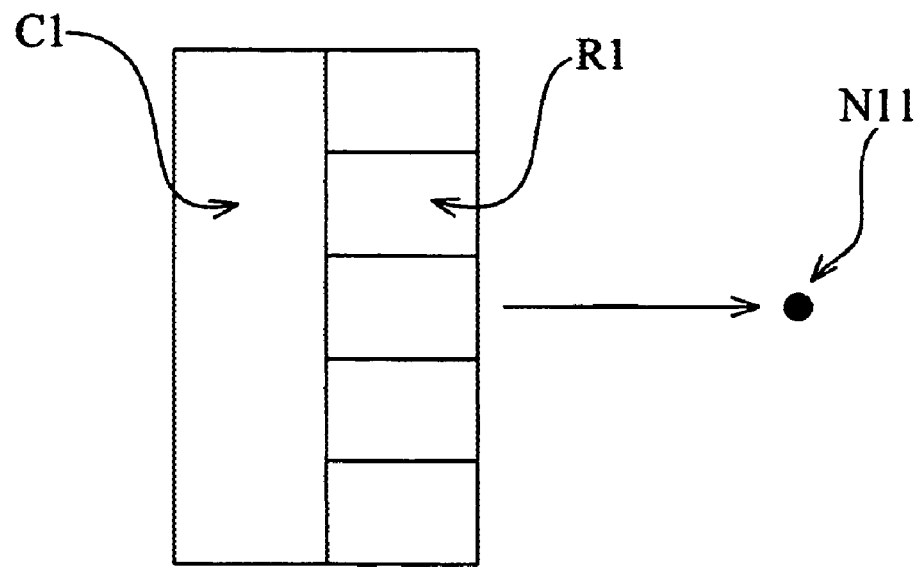
FIG. 3 is an illustration of a corecell and its routing devices that can be mapped to a node.
Figure 4:
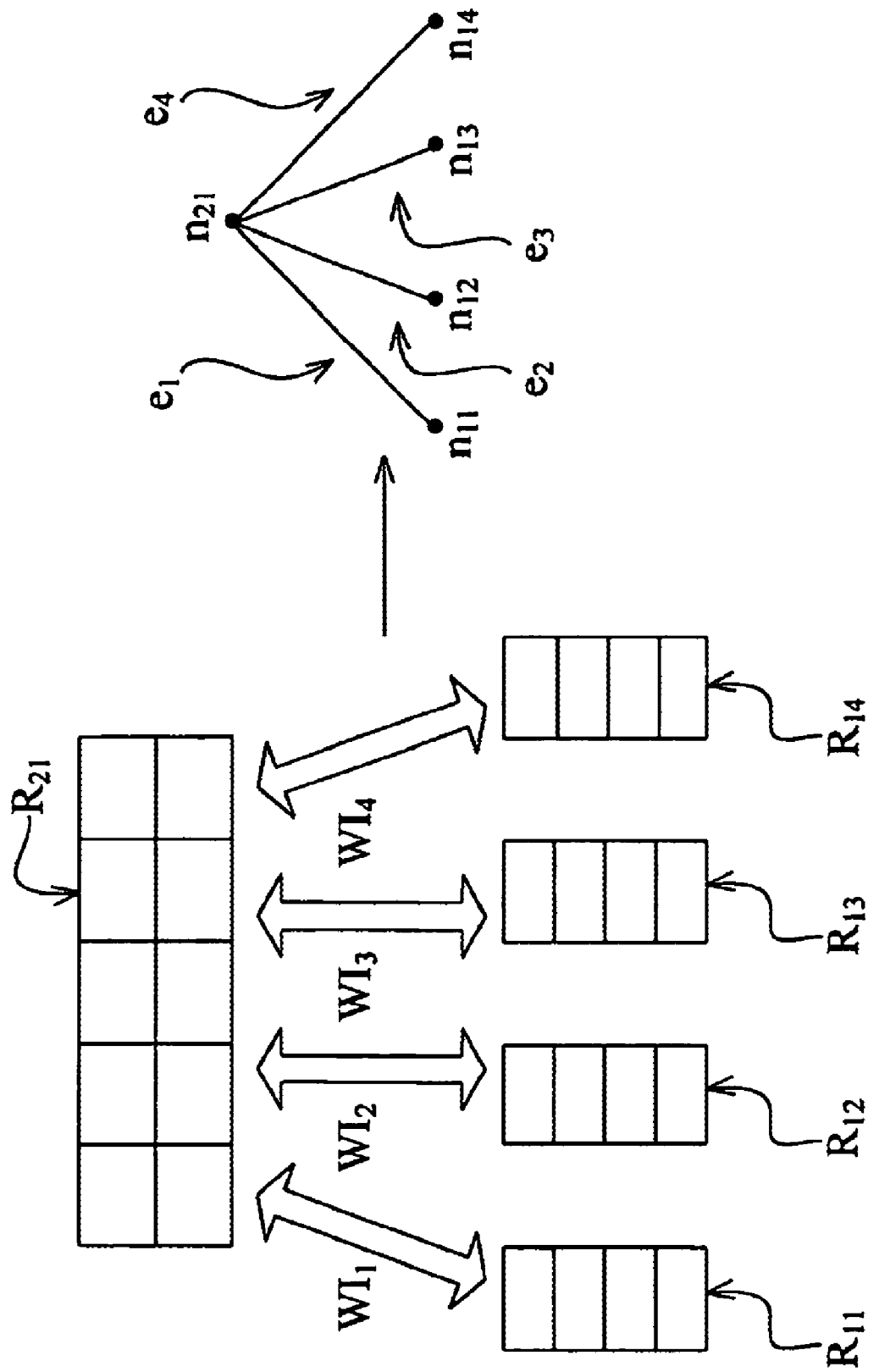
FIG. 4 is an illustration of routing devices for corecells that can be mapped to a tree.

FIG. 3 is an illustration of a corecell ($C_1$) in an integrated circuit with a plurality of inputs and outputs for said corecell ($R_1$) that is mapped to a node R11. Note that in general, multiple physical resources e.g., multiplexers or wires may map to each abstract graph object, i.e., node or edge. These inputs and outputs can be multiplexers in multiplexer based HIRAs but can also be wires or other interconnects in other types of HIRAs. These inputs and outputs for each corecell, i.e., the routing resources for that corecell are mapped to a node n11. FIG. 4 is an illustration of the routing resources for five corecells, $R_{11}$, $R_{12}$, $R_{13}$, $R_{14}$ and $R_{21}$ in a HIRA that are interconnected by additional interconnect routing resources $W_1$, $W_2$, $W_3$, and $W_4$. Typically, these interconnect routing resources represent multiple point to point hardware connections such as wires that connect the routing resources for the corecells. In FIG. 4, the routing resources for the corecells, $R_{11}$, $R_{12}$, $R_{13}$, $R_{14}$ and $R_{21}$, are mapped to the nodes $n_{11}$, $n_{12}$, $n_{13}$, $n_{13}$, and $n_{21}$ respectively while the additional routing resources that interconnect the routing resources of the core cells, $W_1$, $W_2$, $W_3$, and $W_4$, are mapped to the edges $e_1$, $e_2$, $e_3$, and $e_4$ to form a two-level tree with four nodes $n_{11}$, $n_{12}$, $n_{13}$, $n_{14}$ at the first and lower level, and the root node, $n_{21}$, at the second and higher level. After the mapping, each node will contain the following information: the routing resources available for routing at each node, i.e., the inputs and outputs available for the corecell associated with the node, and the interconnect routing resources entering and leaving that node from other nodes, i.e., the available additional routing resources that interconnect the routing resources of the corecell.

During the mapping process, the routing resources for each the target are mapped to its target node in the resulting tree while the routing resources for each driver are mapped to a driver node. For the example in FIG. 4, if $R_{11}$ is a driver of the HIRA and $R_{14}$ is its target, then $n_{11}$ is the driver node and $n_{14}$ is its target node.

Once the routing resources, targets and drivers are mapped to a tree, the global routing of a signal net, i.e., the generation of routes between a driver and its targets reduces to the locating of the minimum spanning tree for the driver node and all its target nodes. The minimum spanning tree for a set of nodes in a tree is the minimum number of edges in the tree that connects said set of nodes. For the example in FIG. 4, if $n_{11}$ is the driver node and $n_{14}$ is its target node, then the minimum spanning tree consists of the edges $e_1$ and $e_4$ and the nodes $n_{11}$, $n_{21}$, and $n_{14}$. Similarly, if $n_{11}$ is the driver node and $n_{13}$ and $n_{14}$ are its target nodes, then the minimum spanning tree consists of the edges $e_1$, $e_3$, and $e_4$ and the nodes $n_{11}$, $n_{13}$, $n_{14}$, and $n_{21}$ Due to the limitations imposed on the design and manufacturing process for the fabrication of many integrated circuits, routing resources for an integrated circuit are often defined and specified before the routing process. Since one or more nodes in HIRA tree may be part of the route for one or more signal nets, global routing of a H such as the routing methods of this invention have to be conducted in conjunction with detail routing, the assignment of routing resources for each node to ensure that routing resources are available and can be dedicated to each of the signal nets at a node.

A HIRA, such as a multiplexer based HIRA, also faces routing constraints related to device size and power consumption. However, since a typical routing resource such as a multiplexer in a HIRA at a given level will only connect to a partial subset of the routing resources such as multiplexers in the levels above and below, the choice of optimal routing resource usage for routing all the signal nets, i.e., the use of the minimum number of routing resources such as multiplexers needed to route all the nets such that each net is routed without impinging on the routing resources needed by any other net, although it does not grow exponentially with the number of signal nets, nodes, and routes, is still non-trivial Detail Routing can be conducted in a variety of ways. One method, a complete and the most general way of assigning routing resources based on graph-theoretic methods, involves noting the routing resources available and the routing resources needed at each node along the routes of the HIRA; casting the noted information in the form of a graph-theoretic maxflow/mincost problem; and, determining the routing resources assignment for each node such that each signal net is routed to reach all targets in that net.

Although this is the most general way to determine routing resource assignment, the complexity of this method grows extremely rapidly with the increase in the number of nodes, levels, and signal nets. This method is difficult to implement and requires long run-times, especially when the quirks of real-world hardware architecture are factored in. However, it guarantees that if the resource assignment succeeds, resource usage is optimal; and, if the resource assignment fails, the design, with the given logic placement, is unroutable.

The preferred methods for global routing in HIRAs, i.e., generating the routes of targets, are reverse routing. That is, the route of a target is generated by traversing from a target node to its driver node. These methods reverse traditional methods where the routes are established by the outwards exploration of possible routes from the driver node. Instead, the routing methods of this invention begin the generation of a route for a target by routing backwards from a target to its driver. This allows for the rapid and easy identification of preferred physical routing resources for each of the signal nets during the global routing process.

Preferred methods for reverse routing of a particular target of a driver can comprise the steps of: traversing from said target node to its peak; and traversing from said peak to the driver node of said target.

The routing distance, i.e., the length of the route, is a parameter essential in the determination of signal delay. For routes that are generated using the preferred methods of this invention, this parameter is easily determined as it is a function of the difference between the level of the peak and the level of target node, and the difference between the level of the peak and the level of the driver node.

These methods are especially efficient for the routing of signal nets with multiple targets, i.e. signal nets of a driver with fan outs where there are one or more branch nodes where the routes of one or more targets converge. During routing, once a branch node for two or more targets with the same driver has been determined, the routes of the two or more targets sharing one branch point merge at that branch point and become the same route beyond that node. Thus, the posterior route of the two or more targets sharing that branch point, i.e., the route of the two or more targets from that branch point to the driver node is the same and need only be determined once.

Branch nodes reduce the complexity of the routing methodology in many HIRAs as they reduce the number of targets routes needed to be handled. They also simultaneously minimize routing resource usage as a single routing resource may be able to be used to control or drive the two or more targets in one signal net at a branch node. In fact a key property of reverse routing is to determine the minimum set of routing resources at each node needed to drive all incoming targets of each net that routes or uses the nodes.

Branch nodes also reduce the complexity of the overall global and detail routing problem at critical junctures when resource demands become high. At the lower levels of a HIRA where nets may have high fanouts, i.e., many targets, resource assignments are relatively simple as there is less resource usage at each node. However, the global routing is more complex as there are more target routes to route. At the higher levels, even after the judicial placement of logic cells to reduce the number of nets spanning these levels, many nodes may be shared by more than one signal net and require a complex and difficult detail routing solution. The overall global and detail routing problem is mitigated at these higher level as the global routing is simplified by the merging of routes and the detail routing is simplified by the reduction of resource usage required by these merged routes.

Preferred methods for global routing are to route one or more targets one level at time by generating an upward traversing route one level at a time and then by generating a downward traversing route one level at a time. The route of a target would be the combination of the upward traversing route and the downward traversing route.

In describing the preferred methods below for routing one or more targets, targets, drivers, target nodes, driver nodes, branch nodes, and peaks will be referred to in the singular or plural forms even though, in actual applications, there may be zero or more of those items at that level.

One preferred way to route one or more selected targets is to start at the lowest level of the tree having target nodes for the selected targets to be routed to begin generating an upward traversing route for the target nodes by the traversing one level upward from the target nodes at this level. Note that routing can be done for one or multiple nodes at the same time.

At the next higher level and each successive higher levels, the following are the steps (traversing one level upward substep) for generating upward traversing routes at that level:

identifying the targets nodes for the selected targets, the nodes for the upward traversing routes generated from a previous level, any branch nodes, i.e., the nodes where two or more upward traversing routes of said selected targets with the same driver converge, and peaks for the selected targets, where a level may have zero or more of the items to be identified;

generating upward traversing routes for the targets nodes at the level for the selected targets by traversing one level upward from each of said target nodes toward their respective peaks, if a target node is not at its peak; if a target node is at its peak, then the upward traversing route for the target having that target node has been generated and the traversing upward stops for that target;

if two or more upward traversing routes of targets converge at a branch node at the level and those targets share the same driver, then merging those routes to form a merged upward traversing route, and, traversing one level upward from the branch node toward the peak of the targets of said upward traversing merged route to form an upward traversing merged route unless the merged route has reached its peak at the branch node. If the merged route has reached its peak, then the traversing upward merged route has been generated and the traversing upward stops; and continuing to generate upward traversing routes and merged routes of selected targets at that level by traversing one level upward from said routes and merged routes toward the peaks of said targets if the routes of these targets have not reached their peaks. If the upward traversing routes of targets have reached their peaks, then the upward traversing routes for those targets have been generated and the traversing upward stops for those routes.

The traversing one level upward step is repeated at each successive level until all the upward traversing routes for the selected targets have reached their peaks, i.e., the traversing one level upward step stops at the highest level peaks for the selected targets. After completing the generation of the upward traversing routes, the generation of the downward traversing routes begins at the level where the highest level peak resides.

At that level, if target nodes for the selected targets exist, then those target nodes are at the peaks of the targets to be routed and the generating downward traversing route begins by traversing from those target nodes one level downward and by traversing from all peaks at that level one level downward.

At the next lower level and each successive lower level, the following are the steps (traversing one level downward substep) for generating downward traversing route at that level:

identifying the peaks for the selected targets, the nodes for the downward traversing routes generated from a previous level, any branch nodes, i.e., the nodes where two or more downward traversing routes of selected targets with the same driver converge, and, drivers of selected targets to be routed, where a level may contain zero or more of the items to be identified;

generating downward traversing routes for the targets with peaks at the level by traversing one level downward from the peaks toward their drivers unless a driver node is also a peak. If a driver node is also the peak, then the traversing downward stops for the target with that driver node and the traversing downward route for that target has been generated;

continuing to generate downward traversing routes for the downward traversing routes and merged routes of targets at the level by traversing one level downward from the downward traversing routes and merged routes, if downward traversing routes of these targets have not reached their drivers. If the downward traversing route of a target has reached its driver, then that downward traversing route has been generated and the traversing downward stops for those targets; and if two or more downward traversing routes of the selected targets converge at a branch node and those targets share the same driver, then merging the downward traversing routes to form a downward traversing merged route, and traversing one level downward from the branch node toward its driver unless the merged route have reached its driver at the branch node. If the downward traversing merged route has reached its driver, then that downward traversing route has been generated and the traversing downward stops.

The traversing one level downward step is repeated until all the downward traversing route for the targets to be routed have reached their respective drivers, i.e., the traversing one level downward step stops at the lowest level where driver for the selected targets resides.

The above described method can also be simplified and applied even if only one target is to be routed.

If the targets to be routed are all the targets for a driver, then the above method is a method for routing a signal net. Depending on the needs of the circuit to be routed, the targets to be routed can be all the targets for a driver, the targets for several drivers, or, all the targets to be routed, or any other combination of targets.

Figure 5A:
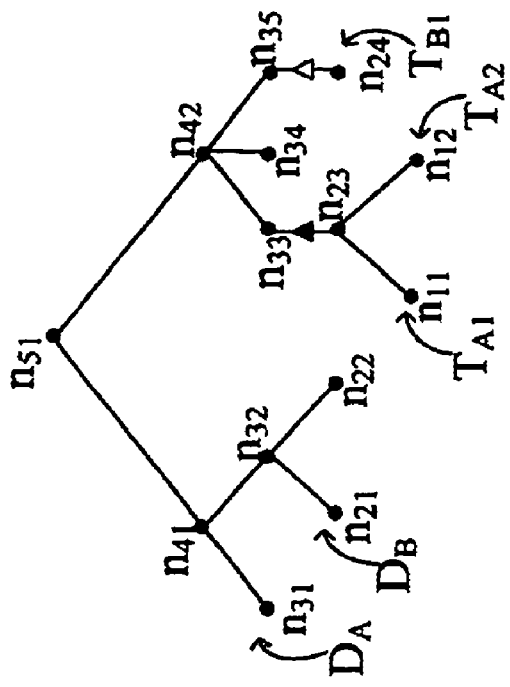
FIGS. 5(a) through (g) are illustrations of global routing using the methods of the present invention.
Figure 5B:
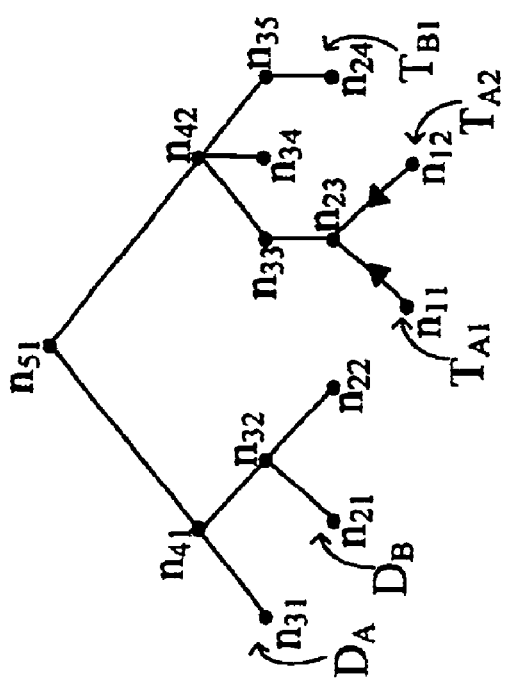
Figure 5C:
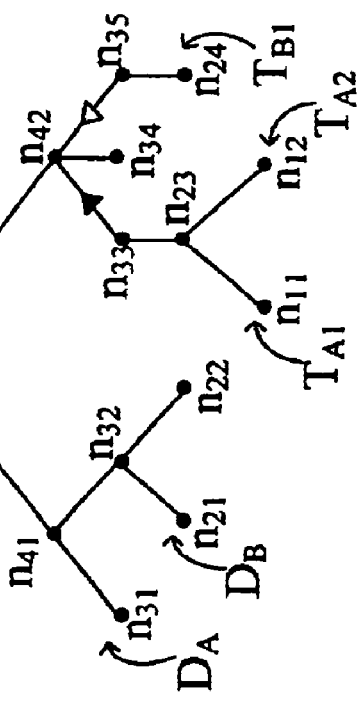
Figure 5E:
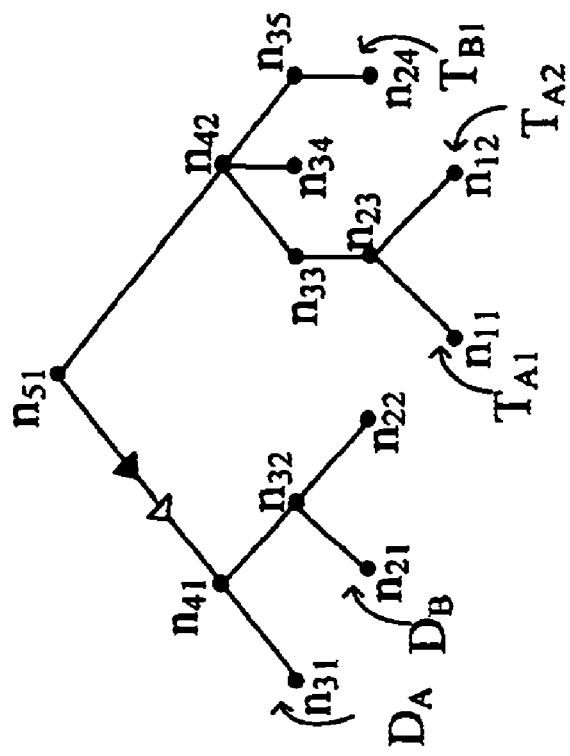
Figure 5D:
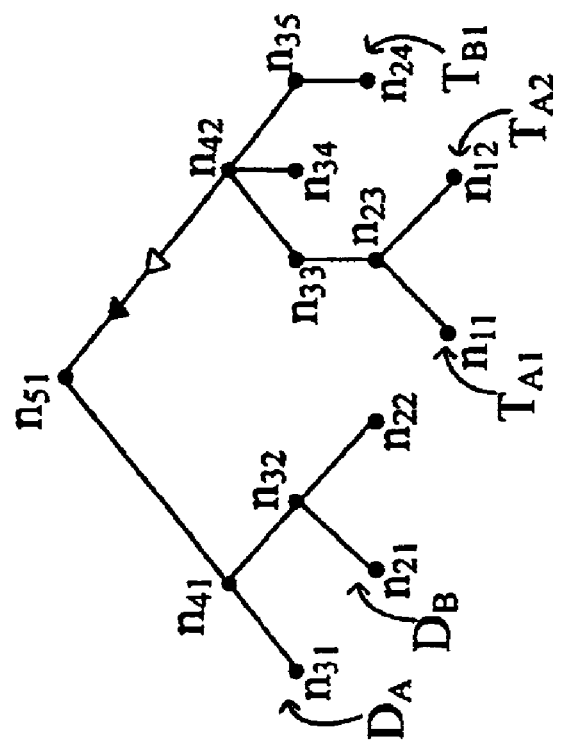
Figure 5G:
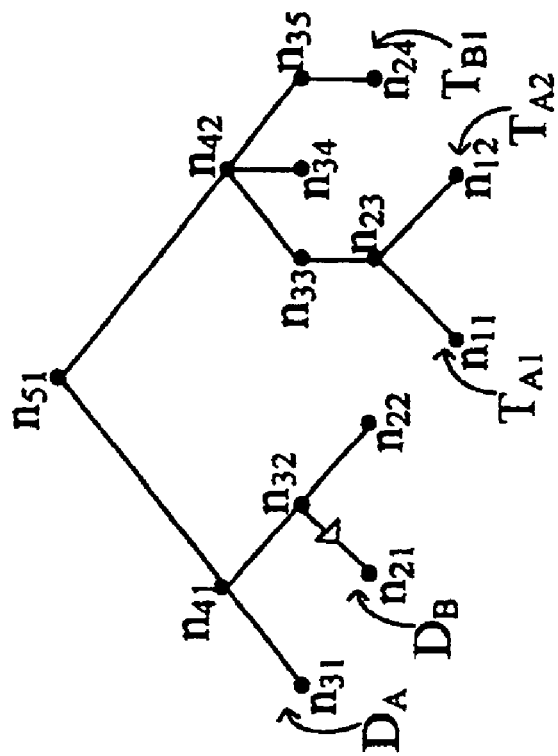
Figure 5F:
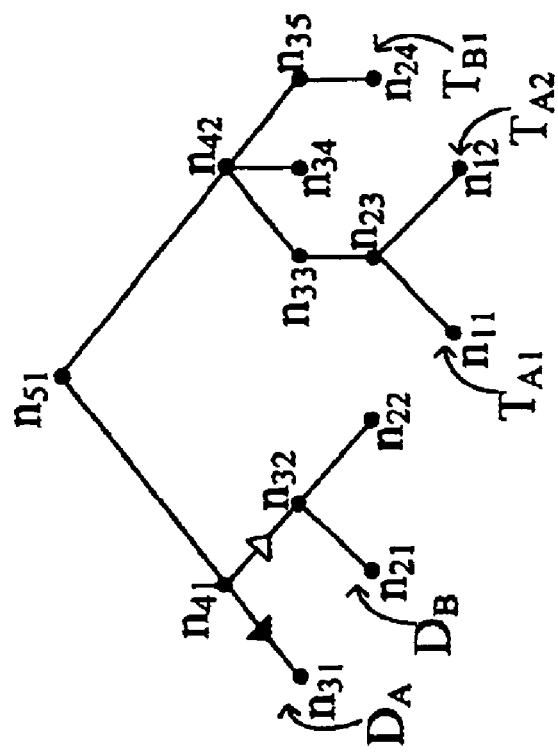

FIGS. 5(a) through (g) illustrate each step of the above method for the five level tree shown in FIG. 2 with two drivers at driver nodes, $D_A$ at $n_{31}$ and $D_B$ at $n_{21}$. The routes that are traversed by the targets at the target nodes $T_{A1}$ and $T_{A2}$ are represented by the solid arrow "→" while the route that is traversed by the target at the target node $T_{B1}$ is represented by the blank arrow "⇨". $D_A$ has two particular target nodes at $T_{A1}$ at $n_{11}$ and $T_{A2}$ at $n_{12}$ while $D_B$ has one target at target node $T_{B1}$ at $n_{24}$. Starting at level 1, the lowest level, the generation of upward traversing routes for the target at target node $T_{A1}$ and target node $T_{A2}$ start by traversing from $T_{A1}$ and $T_{A2}$ to $n_{23}$. FIG. 5(a). At level two, the two upward traversing routes of the targets at $T_{A1}$ and $T_{A2}$ are merged at their branch node $n_{23}$ and the generation of the merged upward traversing route continues by traversing from $n_{23}$ to $n_{33}$. The generation of the upward traversing route for the target at target node $T_{B1}$ begins by traversing from $T_{B1}$ at $n_{24}$ to $n_{35}$. FIG. 5(b). At levels 3 and 4, the generation of the upward traversing merged route continues by traversing upwards from $n_{33}$ to $n_{42}$ to $n_{51}$ while the generation of the upward traversing route for the target at target node $T_{B1}$ continues by traversing from $n_{35}$ to $n_{42}$ to $n_{51}$, FIGS. 5(c) and 5(d). The node $n_{51}$ is the peak for the targets at target nodes $T_{A1}$, $T_{A2}$, and $T_{B1}$. Therefore, the generating of the upwards route is complete and the generating of the downward traversing route begins. The generation of the downward traversing merged route and the generation of the downward traversing route of target at target node $T_{B1}$ begins by traversing downwards one level from $n_{51}$ to node $n_{41}$, FIG. 5(e). At level 4, the generation of the downward traversing merged route continues from $n_{41}$ to its final destination, its driver node $D_A$ at $n_{31}$ by traversing one level downwards while the generation of the downward traversing route for the target at $T_{B1}$ continues by traversing one level downwards to $n_{32}$. FIG. 5(f). At level 3, the generating of the downward traversing merged route has concluded and therefore, only the generating of the downward traversing route for the target at target node $T_{B1}$ continues to its final destination by traversing downwards from $n_{32}$ to $n_{21}$ where its driver node resides. FIG. 5g.

With the above global routing method, one preferred method is to detail route at each level of said HIRA. This method conducts a local resource assignment by assigning routing resources for all nodes in the route of a target after each traversing one level upward step and after each traversing one level downward step. The local resource assignment can be conducted by solving a constrained maxflow/mincost network flow problem for that level. Another preferred detail routing method is to conduct resource assignment once all targets to be routed have been globally routed method. The choice of the method will depend on the number and nature of the targets routed.

Global and detail routing can also be conducted by routing signal nets sequentially, one net at a time. One method for routing a signal net is to use the above method of globally routing a level at a time and selecting the targets to be routed to be all targets for a single driver.

Other preferred methods for the routing of a signal net for a driver and its targets include the processing of each target, i.e., the generation of routes for the targets of a driver with the following steps:

selecting a target; and if one or more branch nodes for said selected target and one or more processed targets exist, identifying the lowest level branch node between said selected target and said one or more processed targets;

traversing from said selected target node to said lowest level branch node; and selecting the posterior route of said one or more processed targets from said lowest level branch node as the posterior route for said selected target from said lowest level branch node;

if a branch node does not exist for the selected target and one or more processed targets do not exist, traversing from said selected target node to the peak of said-selected target; and traversing from the peak to the driver node of said selected target.

A processed target is a target for said driver having a generated route. The posterior route of a target at a branch node for that target is the route of said target from said branch node through its peak to its driver node.

Figure 6:
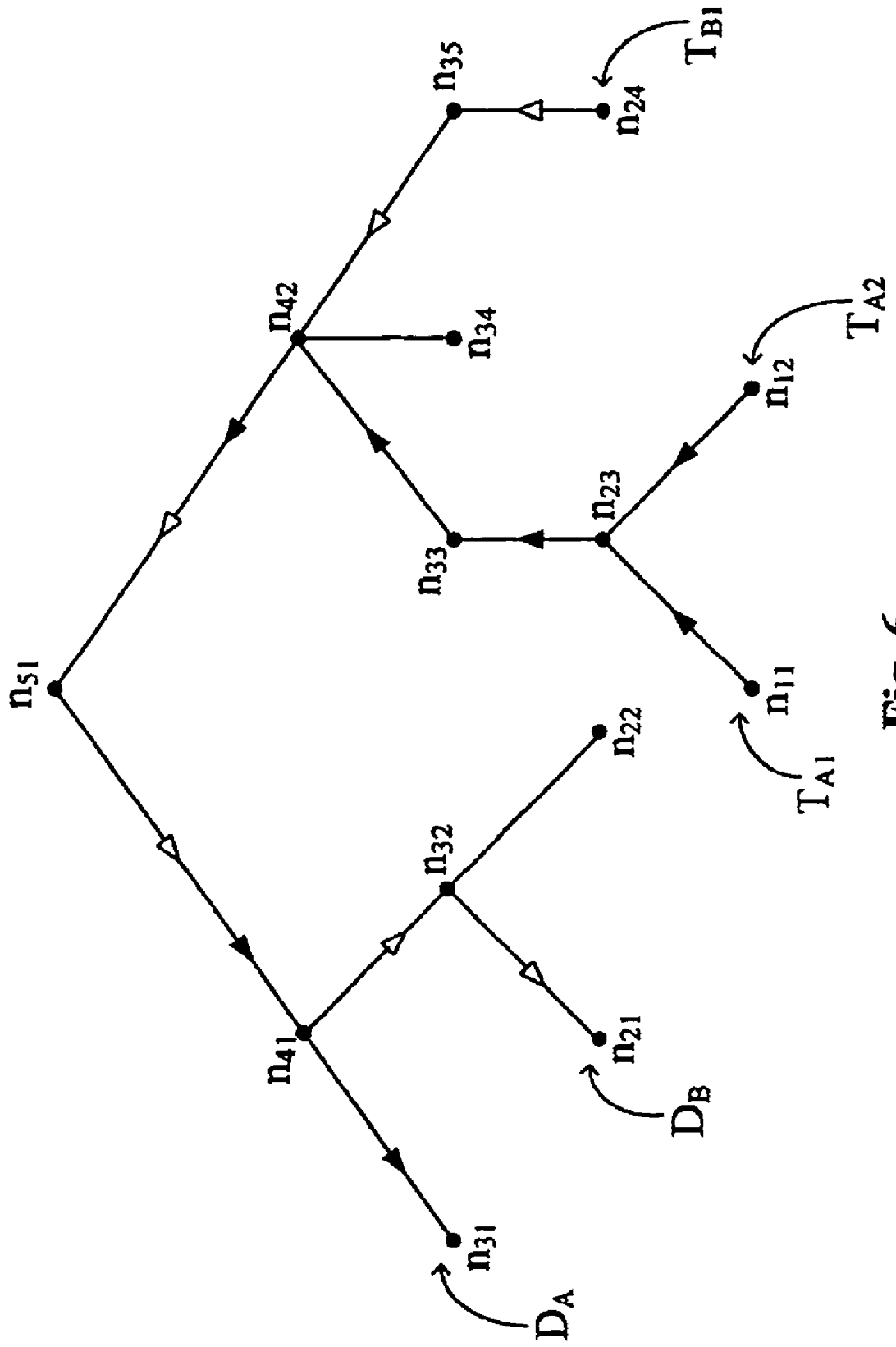
FIG. 6 is an illustration of global and detail routing using another method of the present invention.

FIG. 6 illustrates a preferred method for routing and assignment for the tree illustrated in FIG. 2 with two drivers at the driver nodes $D_A$ and $D_B$. $D_A$ is at $n_{31}$ at level 3 and has two first level targets at the target nodes $T_{A1}$ ($n_{11}$) and $T_{A2}$ ($n_{12}$). $D_B$ at level 2 and node $n_{21}$ has a single target $T_{B1}$ at target node ($n_{24}$). The routes that are traversed by the targets at the target nodes $T_{A1}$ and $T_{A2}$ are represented by the solid arrow "→" while the route that is traversed by the target at the target node $T_B$ is represented by the blank arrow "⇨". To route the signal net for the driver $D_A$, if target at target node $T_{A1}$ is first selected, then its route is generated by traversing upwards from $T_{A1}$ to its peak at $n_{51}$ and then downwards to its driver node $D_A$ at $n_{31}$. If $T_{A2}$ is next selected, its route is generated by traversing to a branch node $n_{23}$ for $T_{A1}$, the processed target and the target at $T_{A2}$ and selecting the posterior route of $T_{A1}$ as the posterior route for $T_{A2}$ from said branch node. Similarly, the signal net for driver $D_B$ is generated by traversing upwards from $T_{B1}$ to its peak at $n_{51}$ and then downwards to its driver node $D_B$ at $n_{12}$.

These methods route signal nets one at a time. That is, the signal nets are routed sequentially rather than in parallel. In HIRAs with congestive designs having many signal nets, setting priority for the routing of signal nets is essential for effective routing different criteria can be used depending on the needs for the IRA. For example, priority can be given to signal nets with a high fanout, i.e., signal nets where a driver has a large number of targets, to optimize routing resource usage. High fanout nets require the most target route mergings. A single resource such as a common multiplexer at a branch node can be used to connect the routing resources of multiple targets routes entering said branch node and a single routing resource leaving said branch node to restrict and merge the routes of the multiple targets.

Another criterion is to give priority to signal nets based on critical-path delay. Theoretically, signal net delays are not a problematic issue in the routing of an ideal HIRA as it is independent of the routing and determined only by the placement level of the driver and its targets. However, signal net delays may be a factor in routing implementations of HIRAs that are topologically hierarchical but nevertheless exhibit delay characteristics that are dependent on factors other than the levels of the hierarchy traversed by the routing. In addition, actual silicon layout typically leads to a range of delays when actual wires are mapped to a single edge of the abstract tree model of a HIRA.

Most HIRAs have multiple nets and one or more nets may share one node. After the global routing of one or more of the nets, the non-trivial detail routing, i.e., the assigning of routing resources for nodes in the net or nets can occur. The full assignment method may be used but this method becomes extremely unwieldy for large HIRAs having thousands of signal nets and potentially thousands of routing resources at each level of the routing hierarchy.

If global routing is used to route one net at a time, then, detail routing can also be conducted sequentially one net at a time. One method is to globally route a net, then detail route this net and repeat this process for all signal nets. The detail routing simply involves choosing the minimal set of currently available routing resources to route the current net without consideration of how this may affect the routing of subsequent nets.

If detail routing fails for a net, i.e., if there are insufficient resources to assign to a net because available resources have been assigned to other nets, one solution is to "unroute", i.e., disconnect or eliminate the routes of previously routed nets that contributed to the failure to detail route a net, route, both globally and in detail, the net with the failed routing, and then attempt to re-route the disconnected or eliminated routes again. Criteria can be set to choose which route to eliminate or disconnect. For example, signal nets with no merged route can be chosen as they are the easiest to reroute.

Depending on the selection of the priority of the nets to be routing, routing nets sequentially may generate sub-optimal resource assignment as the priority selection may not be compatible with the optimal use of resources. However, HIRAs have the advantage that suboptimal routing resource allocations are generally easy to detect. One obvious symptom of a suboptimal resource assignment is when the routes of multiple targets at a branch node cannot be merged because the resources needed to merge those routes have already been used by other nets with a higher routing priority, i.e., other nets that have been already routed. In a multiplexer-based HIRA, this symptom, the unavailability of a single routing resource to connect the multiple routes of multiple targets of a net to a single route at a branch node, is apparent during routing. However, occurrence of this symptom does not necessarily imply suboptimality, especially in congested regions having multiple nets. Those regions may just have insufficient routing resources to support the multiple signal nets. Only solution of the full-scale assignment problem will determine whether optimality can be achieved or whether the HIRA is not routable. Without solving the full resource assignment problem, an upper bound on resource waste can be estimated by comparing the resource usage for the actual multinet signal routing to that which occurs if each net is routed as if there were no other nets competing for the routing resources, and the resulting "selfish-net" resource consumption summed over the nets. In most instances, some failures are acceptable unless the upper bound of such failures constitutes an appreciable fraction of the available routing resources; or if the design fails to route and, at the same time, potential sub optimality in the routing is indicated.

When performing global routing using the methods of this invention, it is advantageous to note and identify the most preferable of the available physical (detail) resources along the routes of the targets. For example, if a node has three routes belonging to the same net converging on it, a routing resource at the node which can drive all three incoming routes is preferable to one which can drive only two or fewer routes. The use of a routing resource that can drive less than three routes would require the use of additional routing resources to drive all three routes. Eliminating sub-optimal routing resources and identifying the optimal ones during global routing will reduce the number of resources that can be assigned during resource assignment and may significantly simplify the complexity of the resource assignment problem.

Global and detail routing by signal nets has been conducted in a logic-dense ex5p design with a 1K-corecell field programmable array that is a multiplexer based HIRA described in United States Patent Application 20030039262. The resulting integrated circuit has high logic utilization with 84.5% of the core cells used and high routing density with approximately 50%, 63%, 64%, 59% and 63% of the available input multiplexers at levels 0 through 4 respectively used. Many of the individual multiplexer blocks exhibited over 80% block usage. With the routing methods of this invention, only a single signal net out of 690 total nets failed to route on the initial attempt. A single cycle of "unroute and retry" was successful in optimally routing both the failed net and rerouting the single net that was "unrouted" to make way for it. Inspection of the routing shows that every merger of target routes occurs at the earliest possible point in the routing process thus confirming visually that this routing using the methods of this invention uses the minimum possible amount of routing resources.

Depending on the specific HIRAs, the above methods can be adjusted to route, either globally or in detail, a plurality of nets simultaneously instead of only a single net at a time. The number of nets selected to be routed at any one time can vary, depending on the characteristics of the nets.

If a HIRA is routed using the methods of this invention and every merger of target routes occurs at the earliest possible point in the routing process, it is routed in a provably resource-optimal fashion, irrespective of the details of the routing method used.

Routing HIRAs using the preferred methods of this invention reduces routing of a HIRA to a set of local routing resource assignment problems that are P-hard, of polynomial time complexity, rather than NP-hard. Moreover, this P-hard routing problem, if it proves satisfactory for the design and the given logic placement of the integrated, guarantees optimal resource usage.

The preferred methods for routing can be modified to apply to some integrated circuits that are "HIRA like." these "A like" integrated circuits have a predominantly HIRA structure with some additional non-hierarchical interconnect elements, i.e., shortcuts. Shortcuts are additional routing resources mapped as edges connecting nodes within the HIRA structure of the "HIRA-like" integrated circuits. These shortcuts are not edges of the tree for the HIRA structure within the integrated circuits. Shortcuts may allow a route to bypass a portion of the route generated with the preferred methods of this invention by crossing directly from one node along the generated route to another node more than a level away along the same generated route.

Figure 7:
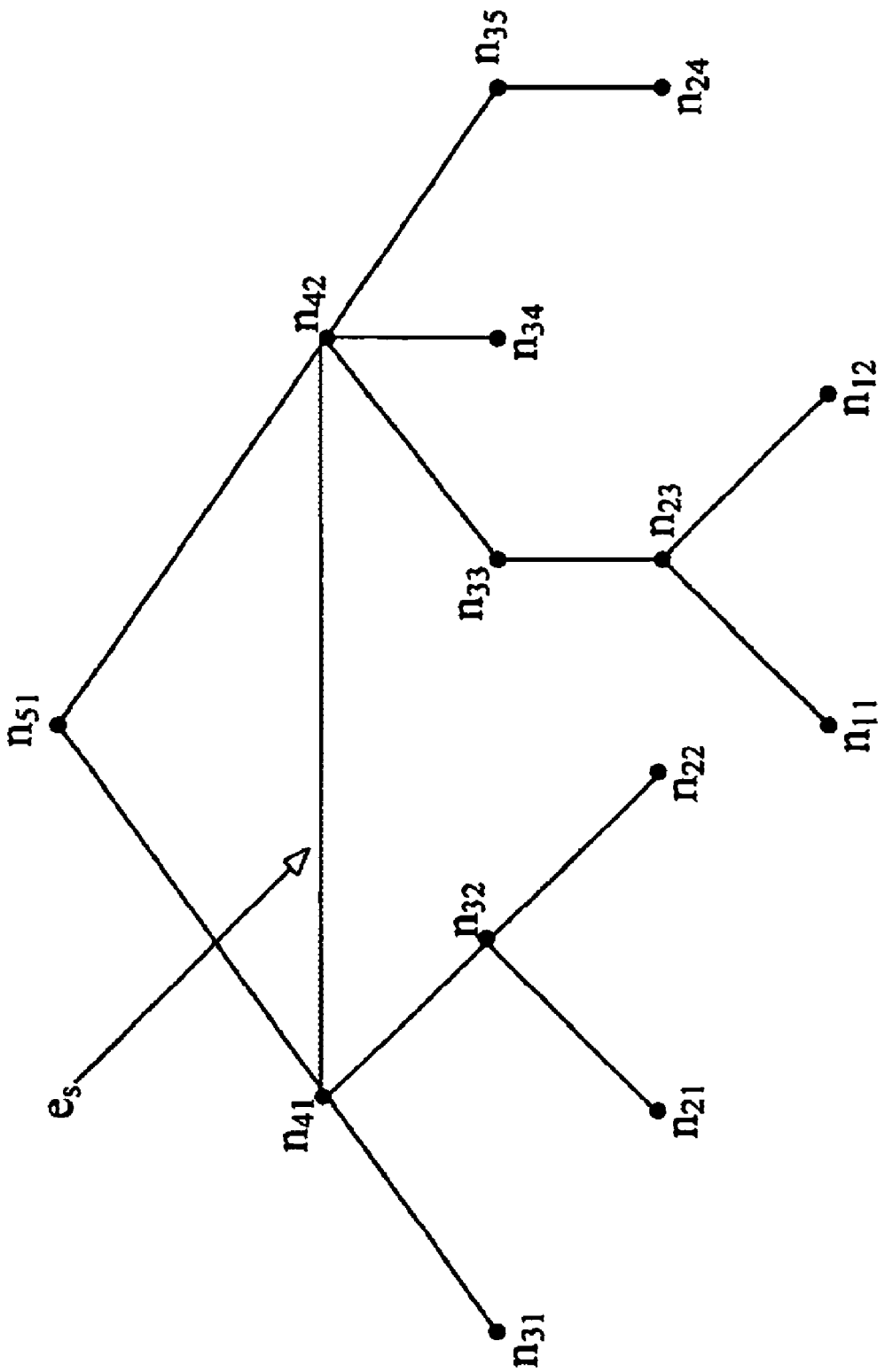
FIG. 7 is an illustration of a shortcut

The edge "$e_5$" in FIG. 7 is an example of a shortcut. Instead of traversing from node $n_{42}$ to $n_{41}$ through $n_{51}$, the shortcut edge "$e_5$", not part of a tree, allows the route to bypass node $n_{51}$ and traverse directly from $n_{42}$ to $n_{41}$, farther than one level traverse using the methods of this invention.

Properly implemented, the reverse-routing methods of this invention can handle shortcut paths in its routing hierarchy. Additional steps can be added to the methods of this invention, such that, during routing, when a route encounters a shortcut at a node, the shortcut is investigated and used if it indeed leads to a shorter route or more optimal resource usage for a target. Owing to their non-hierarchical nature, shortcuts require the examination of the actual possible routing paths permitted by the detailed architecture from the nodes in the route of a target. In other words, shortcuts require the routing software to allow for the assignment of routes using detailed connectivity information beyond the routing methods for routing HIRAs of this invention.

Shortcuts can also be added as a performance enhancement in the routing of "HIRA-like" IRAs, especially large IRAs. Shortcuts can be used simply to enhance the resources available for routing, More crucially, because of their level-by-passing nature, can be selected and used for timing-critical nets to bypass portion of the routes generated by the methods of this invention to achieve higher performance. See Ronald Greenberg, "The Fat-Pyramid and Universal Parallel Computation Independent of Wire Delay," *IEEE Transactions on Computers,* 43(12):1358-1365, December 1994; and André DeHon, "Balancing Interconnect and Computation in a Reconfigurable Computing Array" FPGA 1999 Conference, http://brass.cs.berkeley.edu/documents/fixedws_frpa99.html. If all shortcuts that can be used are in fact used, the resulting routing resource usage is again optimal. When a suitable net routing prioritization criterion based on timing criticality is also used, the resulting routing also helps optimize design performance for operation speed as well.

While the present invention has been described with reference to certain preferred embodiments, it is to be understood that the present invention is not limited to such specific embodiments. Rather, it is the inventor's contention that the invention be understood and construed in its broadest meaning as reflected by the following claims. Thus, these claims are to be understood as incorporating not only the preferred embodiments described herein but all those other and further alterations and modifications as would be apparent to those of ordinary skilled in the art.

I claim:

1. A method for routing a circuit having an hierarchical interconnect architecture, one or more routing resources, and one or more drivers, wherein each driver having one or more targets, and that a tree having one or more nodes at one or more levels and one or more edges connecting said nodes is used, comprising the steps of:
   mapping said routing resources to the nodes and edges of the tree;
   mapping each target to a node of said tree as a target node;
   mapping each driver to a node of said tree as a driver node; and
   routing said targets and said drivers, wherein routes are generated by routing from the targets to one or more of the drivers.

2. The method of claim 1 wherein said routing step comprising a global routing sub-step for generating one or more routes for between a between a target and its respective driver.

3. The method of claim 1 wherein said routing step comprising a global routing sub-step for generating one or more routes for a target by routing from the target node to its respective driver node.

4. The method of claim 1 wherein said routing step globally routes a target to its driver as a function of a minimum spanning tree spanning the respective driver node and target node.

5. The method of claim 1 wherein said routing step includes the sub-step of: assigning routing resources to the nodes of said tree.

6. The method of claim 2 wherein said routing step includes the sub-step of: assigning routing resources to the nodes in the one or more routes of the said target.

7. The method of claim 3 wherein said routing step includes the sub-step of:
   assigning routing resources to the nodes in the one or more routes of the said target.

8. The method of claim 1 wherein said routing step further comprising the following sub steps for globally routing a target having a peak by generating a route from a target to its respective driver:
   traversing from the target node of said target to its peak; and
   traversing from the peak to the driver node of said driver.

9. The method of claim 8 said routing step includes the sub-step of:
   assigning routing resources to the nodes in the route of said target.

10. The method of claim 1 wherein said circuit having zero or more processed targets with generated routes, said generated routes having zero or more branch nodes and posterior routes, and each of said targets having a peak; and wherein said routing step comprising the following global routing sub-steps for generating routes for said targets to their respective drivers:
  selecting a target;
  wherein for one or more branch nodes for said selected target and one or more processed targets,
    identifying the lowest level branch node between said selected target and said one or more processed targets;
    traversing from said the target node of selected target to said lowest level branch node; and
    selecting the posterior route of said one or more processed targets from said lowest level branch node as the posterior route for said selected target from said lowest level branch node.

11. The method of claim 10 wherein the following step is added:
  assigning routing resources to the nodes in the routes of the processed targets of said driver.

12. A method for routing one or more targets in a circuit having an hierarchical interconnect architecture, one or more routing resources, one or more drivers, and one or more peaks for said one or more targets, wherein each driver having one or more targets, and that a tree having one or more nodes at one or more levels and one or more edges connecting said nodes is used, comprising the steps of:
  mapping said routing resources to the nodes and the edges of the tree;
  mapping each of said one or more targets to a node of said tree as a target node;
  mapping each driver to a node of said tree as a driver node;
  generating one or more routes having upward traversing routes and downward traversing routes for said targets;
  wherein the generating of the upward traversing routes at a level of said tree comprises the sub-steps of:
    traversing one level upward from the target nodes of said targets at said level toward the respective peaks of said targets; and
    traversing one level upward from said upward traversing routes of said targets at said level toward the respective peaks of said targets; and wherein the generating of the downward traversing routes at a level of said tree comprises the sub-steps of:
    traversing one level downward from the respective peaks of said targets at said level toward the driver nodes of the respective drivers of said targets; and
    traversing one level downward from said downward traversing routes of said targets at said level toward the driver nodes of the respective drivers of said targets.

13. The method of claim 12 wherein
  the generating step in generating upward traversing routes starts from the lowest level of said tree and repeating said generating step for each level going upward until the upward traversing routes of said targets have reached their respective peaks; and
  the generating steps in generating downward traversing routes starts from the highest level of said tree with respective peaks for said targets and repeating the generating step for each level going downward until said downward traversing routes of said targets have reached their respective drivers.

14. The method of claim 12 wherein said routing step also comprising the step of identifying the available routing resources for the nodes of said level after each traversing one level upward step and after each traversing one level downward step.

15. The method of claim 12, in routing two or more targets, wherein
  said upward traversing routes having zero or more branch nodes and said downward traversing routes having zero or more branch nodes;
  for said traversing one level upward step, when two or more upward traversing routes of said targets sharing the same driver converge at a branch node, merging said two or more upward traversing routes to form an upward traversing merged route, and traversing one level upward from said upward traversing merged route; and
  for said traversing one level downward step, when two or more downward traversing routes of said targets sharing the same driver converge at a branch node, merging said two or more downward traversing routes to form a downward traversing merged route, and traversing one level downward from said downward traversing merged route.

16. The method of claim 12 wherein the following step is added after said traversing one level upward sub-step, assigning routing resources to the nodes at said level; and the following step is added after said traversing one level downward sub-step, assigning routing resources to the nodes at said level.

17. The method of claim 13 wherein the following step is added after said traversing one level upward sub-step, assigning routing resources to the nodes at said level; and the following step is added after said traversing one level downward sub-step, assigning routing resources to the nodes at said level.

18. The method of claim 15 wherein the following step is added after said traversing one level upward sub-step, assigning routing resources to the nodes at said level; and the following step is added after said traversing one level downward sub-step, assigning routing resources to the nodes at said level.

19. A method for routing a circuit having an hierarchical interconnect architecture, one or more routing resources, and one or more drivers, wherein each driver having one or more targets, each target having a peak, and that a tree having one or more nodes and one or more edges connecting said nodes is used, comprising the steps of:
  mapping said routing resources to the nodes and edges of the tree;
  mapping each target to a node of said tree as a target node;
  mapping each driver to a node of said tree as a driver node;
  generating routes for one or more targets to their respective drivers; and
  assigning routing resources to the nodes in the routes of the processed targets of said drivers; and wherein
    said circuit having zero or more processed targets with generated routes,
    said generated routes having zero or more branch nodes and posterior routes,
    each of said targets having a peak; and
    said routing step comprising the following global routing sub-steps for generating routes for said targets to their respective drivers:
      selecting a target;
      wherein there are one or more branch nodes for said selected target and one or more processed targets,
        identifying the lowest level branch node between said selected target and said one or more processed targets;

traversing from the target node of said selected target to said lowest level branch node; and selecting the posterior route of said one or more processed targets from said lowest level branch node as the posterior route for said selected target from said lowest level branch node;

wherein there are zero branch nodes for said selected target and processed targets, traversing from the target node of said selected target to a peak of said selected target; and traversing from the peak to the driver node of the driver of said selected target.

20. The method of claim 10 wherein there are zero branch nodes for said selected target and processed targets, traversing from the target node of said selected target to a peak of said selected target; and traversing from the peak to the driver node of the driver of said selected target.

* * * * *